United States Patent
Yang et al.

(10) Patent No.: US 12,506,448 B2
(45) Date of Patent: Dec. 23, 2025

(54) ELECTRONIC DEVICE COMPRISING AMPLIFIER CIRCUIT FOR PROCESSING WIDEBAND RF SIGNAL

(71) Applicant: SAMSUNG ELECTRONICS CO., LTD., Suwon-si (KR)

(72) Inventors: Dongil Yang, Suwon-si (KR); Jooseung Kim, Suwon-si (KR); Junghwan Son, Suwon-si (KR); Hyunseok Choi, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 718 days.

(21) Appl. No.: 17/860,467

(22) Filed: Jul. 8, 2022

(65) Prior Publication Data

US 2022/0345093 A1 Oct. 27, 2022

Related U.S. Application Data

(63) Continuation of application No. PCT/KR2021/000313, filed on Jan. 11, 2021.

(30) Foreign Application Priority Data

Jan. 10, 2020 (KR) .................. 10-2020-0003701

(51) Int. Cl.
*H03F 3/191* (2006.01)
*H03F 1/07* (2006.01)
(Continued)

(52) U.S. Cl.
CPC .............. *H03F 1/565* (2013.01); *H03F 1/07* (2013.01); *H03F 3/189* (2013.01); *H03F 3/60* (2013.01);
(Continued)

(58) Field of Classification Search
CPC . H03F 1/565; H03F 1/07; H03F 3/189; H03F 3/60; H03F 2200/378;
(Continued)

(56) References Cited

U.S. PATENT DOCUMENTS 7,486,134 B2   2/2009  Chang et al.
7,786,797 B2 * 8/2010  Okazaki ................ H03F 1/0288
                                                      330/124 R
(Continued)

FOREIGN PATENT DOCUMENTS

JP          5656653        1/2015
KR   10-2008-0108527    12/2008
(Continued)

OTHER PUBLICATIONS

International Search Report for PCT/KR2021/000313, mailed.
Written Opinion of the ISA for PCT/KR2021/000313, mailed.

*Primary Examiner* — Khanh V Nguyen
(74) *Attorney, Agent, or Firm* — Nixon & Vanderhye P.C.

(57) ABSTRACT

Disclosed is an electronic device comprising: a wireless communication circuit for generating an RF signal, an amplifier circuit electrically connected to the wireless communication circuit and configured to amplify the RF signal, and an antenna connected to the amplifier circuit. The amplifier circuit may comprise: a first amplifier; a second amplifier; a first transmission path connected to an output terminal of the first amplifier and the antenna; a second transmission path connected to an output terminal of the second amplifier and the first transmission path; a first variable impedance circuit located on the first transmission path and configured to change an electrical length of the first transmission path based on the frequency of the RF signal; and a second variable impedance circuit located on the
(Continued)

second transmission path and configured to change the electrical length based on a power mode.

11 Claims, 12 Drawing Sheets

(51) Int. Cl.
| | | |
|---|---|---|
| *H03F 1/56* | (2006.01) | |
| *H03F 3/189* | (2006.01) | |
| *H03F 3/60* | (2006.01) | |
| *H03H 7/38* | (2006.01) | |

(52) U.S. Cl.
CPC ......... *H03H 7/38* (2013.01); *H03F 2200/378* (2013.01)

(58) Field of Classification Search
CPC .. H03F 2200/451; H03F 1/0288; H03F 3/245; H03F 3/19; H03F 3/24; H03F 3/602; H03F 2200/423; H03F 3/68; H03F 3/607; H03F 3/211; H03F 3/195; H03H 7/38
USPC ...................... 330/286, 295, 124 R
See application file for complete search history.

(56) References Cited

U.S. PATENT DOCUMENTS

| | | |
|---|---|---|
| 8,305,141 B2 | 11/2012 | Jeong et al. |
| 8,594,596 B2 | 11/2013 | Kimura et al. |
| 8,611,834 B2 | 12/2013 | Harris et al. |
| 8,855,584 B2 | 10/2014 | Harris et al. |
| 8,970,319 B2 | 3/2015 | Furuta et al. |
| 8,975,981 B2 | 3/2015 | See et al. |
| 9,054,756 B2 | 6/2015 | See et al. |
| 9,450,543 B2 | 9/2016 | Yang et al. |
| 9,603,187 B2 | 3/2017 | Tasic et al. |
| 10,355,647 B2 | 7/2019 | Datta et al. |
| 10,505,512 B2 | 12/2019 | Choi et al. |
| 11,101,775 B2 | 8/2021 | Datta et al. |
| 2010/0148862 A1 | 6/2010 | Woo |
| 2011/0279178 A1 | 11/2011 | Outaleb et al. |
| 2012/0105147 A1* | 5/2012 | Harris ................ H03F 1/56 330/57 |
| 2016/0181985 A1* | 6/2016 | Aoki ................ H03F 1/0294 330/124 R |
| 2016/0190997 A1* | 6/2016 | Tanimoto ................ H03F 3/24 330/295 |

FOREIGN PATENT DOCUMENTS

| | | |
|---|---|---|
| KR | 10-2010-0069454 | 6/2010 |
| KR | 10-1091971 | 12/2011 |
| KR | 10-1124425 | 3/2012 |
| KR | 10-1284814 | 7/2013 |
| KR | 10-2013-0129367 | 11/2013 |
| KR | 10-2016-0020380 | 2/2016 |
| KR | 10-1654927 | 9/2016 |
| KR | 10-1678753 | 11/2016 |
| KR | 10-1694709 | 1/2017 |
| KR | 10-1867396 | 6/2018 |
| KR | 10-1912287 | 10/2018 |

* cited by examiner

ELECTRONIC DEVICE COMPRISING AMPLIFIER CIRCUIT FOR PROCESSING WIDEBAND RF SIGNAL

CROSS-REFERENCE TO RELATED APPLICATIONS

This application is a continuation of International Application No. PCT/KR2021/000313 designating the United States filed on Jan. 11, 2021, in the Korean Intellectual Property Receiving Office and claiming priority to Korean Patent Application No. 10-2020-0003701, filed on Jan. 10, 2020 in the Korean Intellectual Property Office, the disclosures of which are incorporated by reference herein in their entireties.

BACKGROUND

Field

The disclosure relates to an electronic device including an amplifier circuit connected with an antenna.

Description of Related Art

An electronic device (e.g., a smartphone) may have an antenna for wireless communication. The antenna used for wireless communication may transmit or receive an RF signal with a specific frequency band. The electronic device may include an amplifier circuit for amplifying an RF signal, such that its transmission and reception function is not degraded by propagation signal loss.

An electronic device may use a wideband RF signal including various frequencies. The electronic device may implement a transmission line connected with an amplifier by a λ/4 length to convert impedance of a load terminal. However, there may be a limitation in a wideband operation due to a quality factor (e.g., a Q value) and a band width characteristic of the transmission line itself.

SUMMARY

Embodiments of the disclosure may provide an electronic device for applying a MEMS switch to a λ/4 impedance transmission line of an amplifier circuit including a Doherty amplifier structure to efficiently operate for RF signals of various frequencies, in the electronic device which uses a wideband RF signal.

In accordance with an example embodiment of the disclosure, an electronic device is provided. The electronic device may include: a wireless communication circuit configured to generate an RF signal, an amplifier circuit electrically connected with the wireless communication circuit and configured to amplify the RF signal, and an antenna connected with the amplifier circuit. The amplifier circuit may include: a first amplifier, a second amplifier, a first transmission path connected with an output terminal of the first amplifier and the antenna, a second transmission path connected with an output terminal of the second amplifier and the first transmission path, a first variable impedance circuit located on the first transmission path and configured to change an electrical length of the first transmission path based on a frequency of the RF signal, and a second variable impedance circuit located on the second transmission path and configured to change an electrical length based on a power mode.

According to various example embodiments disclosed in the disclosure, the electronic device for efficiently performing communication using a wideband RF signal may be provided.

In addition, various effects ascertained directly or indirectly through the disclosure may be provided.

BRIEF DESCRIPTION OF THE DRAWINGS

The above and other aspects, features and advantages of certain embodiments of the present disclosure will be more apparent from the following detailed description, taken in conjunction with the accompanying drawings, in which.

Figure 1:
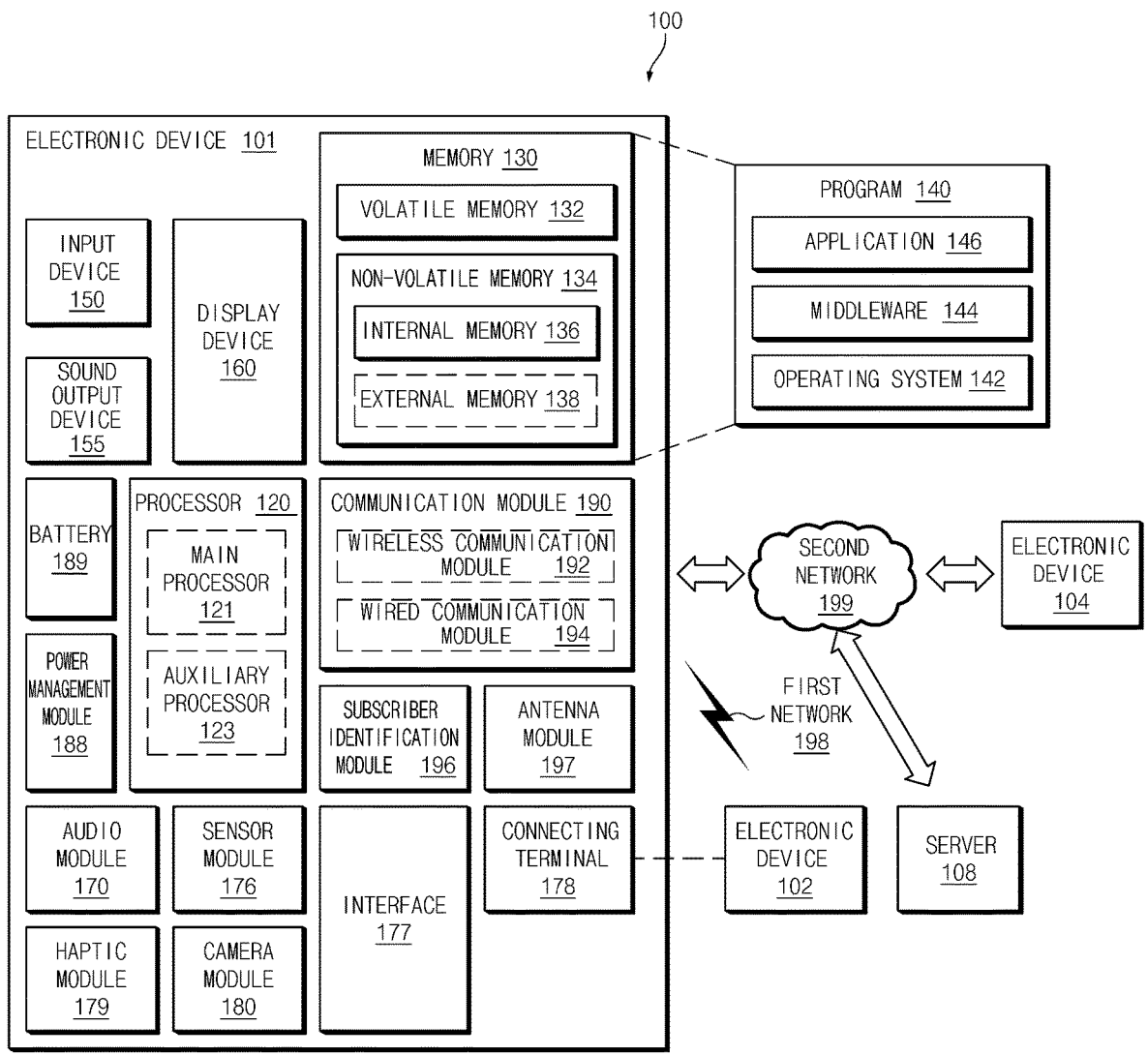
FIG. 1 is a block diagram illustrating an example electronic device in a network environment, according to various embodiments.

With regard to description of drawings, the same or similar components will be marked by the same or similar reference signs.

DETAILED DESCRIPTION

Hereinafter, various example embodiments of the disclosure will be described in greater detail with reference to the accompanying drawings. However, it should be understood that the disclosure is not limited to specific embodiments, but rather includes various modifications, equivalents and/or alternatives of the embodiments of the present disclosure. Regarding description of the drawings, like reference numerals may refer to like elements.

FIG. 1 is a block diagram illustrating an example electronic device 101 in a network environment 100 according to various embodiments. Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In various embodiments, at least one (e.g., the display device 160 or the camera module 180) of the components may be omitted from the electronic device 101, or one or more other components may be added in the electronic device 101. In various embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. According to an embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by other component (e.g., the processor 120) of the electronic device 101, from the outside (e.g., a user) of the electronic device 101. The input device 150 may include, for example, a microphone, a mouse, a keyboard, or a digital pen (e.g., a stylus pen).

The sound output device 155 may output sound signals to the outside of the electronic device 101. The sound output device 155 may include, for example, a speaker or a receiver. The speaker may be used for general purposes, such as playing multimedia or playing record, and the receiver may be used for an incoming calls. According to an embodiment, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to an embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 101. According to an embodiment, the antenna module 197 may include an antenna including a radiating element including a conductive material or a conductive pattern formed in or on a substrate (e.g., PCB). According to an embodiment, the antenna module 197 may include a plurality of antennas. In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

Figure 2:
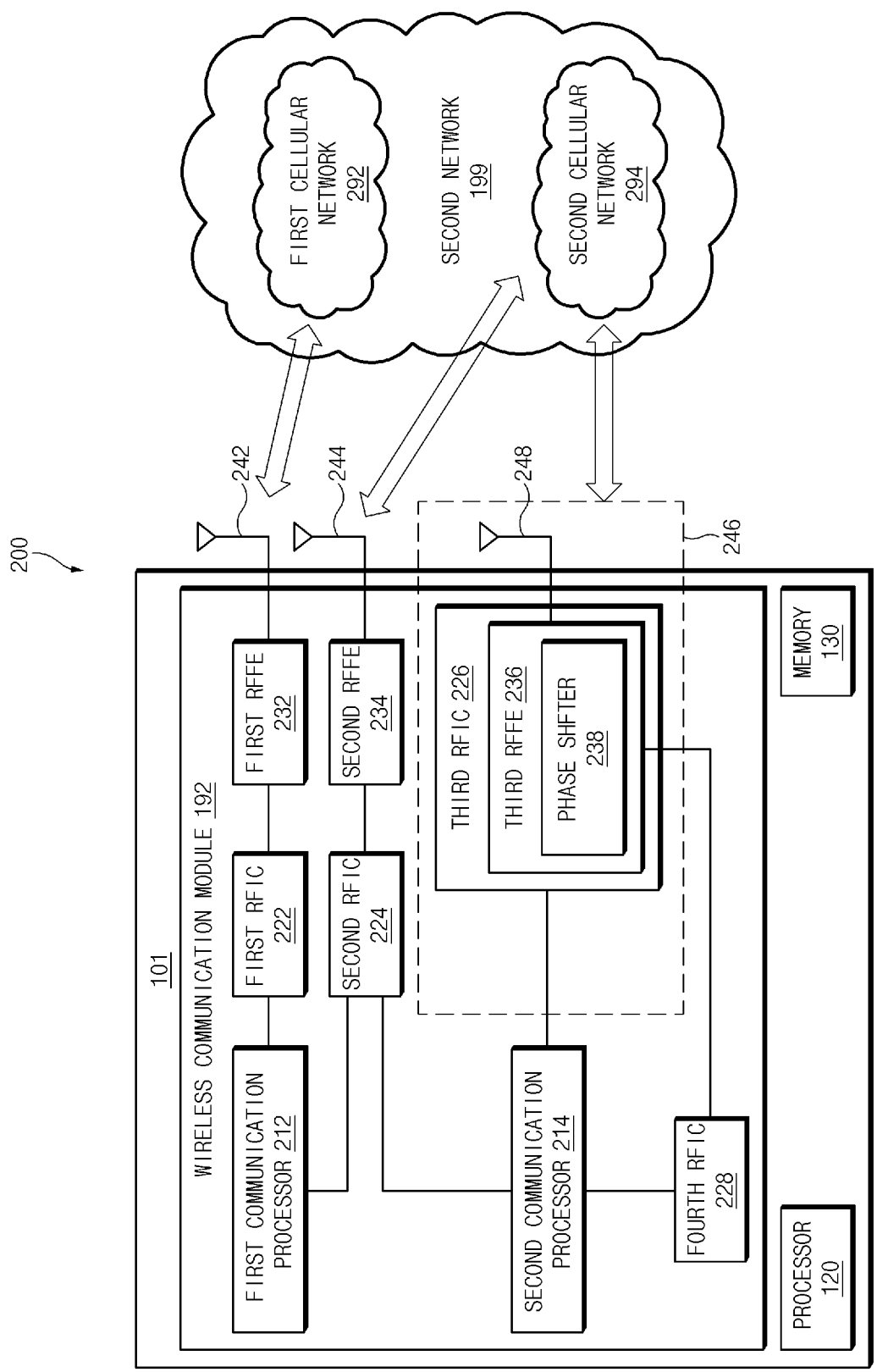
FIG. 2 is a block diagram illustrating an example configuration of an electronic device for supporting legacy network communication and 5G network communication, according to various embodiments.

FIG. 2 is a block diagram 200 illustrating an example configuration of the electronic device 101 for supporting legacy network communication and 5G network communication, according to various embodiments. Referring to FIG. 2, the electronic device 101 may include a first communication processor (e.g., including processing circuitry) 212, a second communication processor (e.g., including processing circuitry) 214, a first radio frequency integrated circuit (RFIC) 222, a second RFIC 224, a third RFIC 226, a fourth RFIC 228, a first radio frequency front end (RFFE) 232, a second RFFE 234, a first antenna module 242, a second antenna module 244, and an antenna 248. The electronic device 101 may further include the processor 120 and the memory 130. The second network 199 may include a first cellular network 292 and a second cellular network 294. According to an embodiment, the electronic device 101 may further include at least one of the components illustrated in FIG. 1, and the second network 199 may include at least one other network. According to an embodiment, the first communication processor 212, the second communication processor 214, the first RFIC 222, the second RFIC 224, the fourth RFIC 228, the first RFFE 232, and the second RFFE 234 may form at least a part of the wireless communication module 192. According to an embodiment, the fourth RFIC 228 may be omitted or may be included as a part of the third RFIC 226.

The first communication processor 212 may include various processing circuitry and establish a communication channel of a band to be used for wireless communication with the first cellular network 292 and may support legacy network communication over the established communication channel. According to various embodiments, the first cellular network 292 may be a legacy network including 2G, 3G, 4G, and/or long term evolution (LTE) network. The second communication processor 214 may include various processing circuitry and support the establishment of a communication channel corresponding to a specified band (e.g., about 6 GHz~about 60 GHz) among bands to be used for wireless communication with the second cellular network 294 and 5G network communication via the established communication channel. According to various embodiments, the second cellular network 294 may be 5G network defined in 3GPP. Additionally, according to an embodiment, the first communication processor 212 or the second communication processor 214 may establish a communication channel for a specified band (e.g., about 6 GHz or lower) of the bands to be used for wireless communication with the second cellular network 294 and may support 5G network communication through the established communication channel. According to an embodiment, the first communication processor 212 and the second communication processor 214 may be implemented within a single chip or a single package. According to various embodiments, the first communication processor 212 or the second communication processor 214 may be implemented in a single chip or a single package together with the processor 120, the auxiliary processor 123 of FIG. 1, or the communication module 190 of FIG. 1.

In the case of transmitting a signal, the first RFIC 222 may convert a baseband signal generated by the first communication processor 212 into a radio frequency (RF) signal of approximately 700 MHz to approximately 3 GHz that is used in the first cellular network 292 (e.g., a legacy network). In the case of receiving a signal, an RF signal may be obtained from the first cellular network 292 (e.g., a legacy network) through an antenna (e.g., the first antenna module 242) and may be pre-processed through an RFFE (e.g., the first RFFE 232). The first RFIC 222 may convert the preprocessed RF signal to a baseband signal so as to be processed by the first communication processor 212.

In the case of transmitting a signal, the second RFIC 224 may convert a baseband signal generated by the first communication processor 212 or the second communication processor 214 into an RF signal (hereinafter referred to as a "5G Sub6 RF signal") in a Sub6 band (e.g., approximately 6 GHz or lower) used in the second cellular network 294 (e.g., a 5G network). In the case of receiving a signal, a 5G Sub6 RF signal may be obtained from the second cellular network 294 (e.g., a 5G network) through an antenna (e.g., the second antenna module 244) and may be pre-processed through an RFFE (e.g., the second RFFE 234). The second RFIC 224 may convert the preprocessed 5G Sub6 RF signal to a baseband signal so as to be processed by a communication processor corresponding to one of the first communication processor 212 or the second communication processor 214.

The third RFIC 226 may convert a baseband signal generated by the second communication processor 214 into an RF signal (hereinafter referred to as a "5G Above6 RF signal") in a 5G Above6 band (e.g., approximately 6 GHz to approximately 60 GHz) to be used in the second cellular network 294 (e.g., a 5G network). In the case of receiving a signal, a 5G Above6 RF signal may be obtained from the second cellular network 294 (e.g., a 5G network) through an antenna (e.g., the antenna 248) and may be pre-processed through a third RFFE 236. For example, the third RFFE 236 may perform pre-processing on a signal using a phase shifter 238. The third RFIC 226 may convert the preprocessed 5G Above 6 RF signal to a baseband signal so as to be processed by the second communication processor 214. According to an embodiment, the third RFFE 236 may be formed as the part of the third RFIC 226.

According to an embodiment, the electronic device 101 may include the fourth RFIC 228 independently of the third RFIC 226 or as at least a part of the third RFIC 226. In this case, the fourth RFIC 228 may convert a baseband signal generated by the second communication processor 214 into an RF signal (hereinafter referred to as an "IF signal") in an intermediate frequency band (e.g., approximately 9 GHz to approximately 11 GHz) and may provide the IF signal to the third RFIC 226. The third RFIC 226 may convert the IF signal into a 5G Above6 RF signal. At the time of reception, the 5G Above6 RF signal may be received from the second cellular network 294 (e.g., a 5G network) via an antenna (e.g., the antenna 248) and may be converted to the IF signal by the third RFIC 226. The fourth RFIC 228 may convert the IF signal into a baseband signal to be processed by the second communication processor 214.

According to an embodiment, the first RFIC 222 and the second RFIC 224 may be implemented as at least part of a single chip or a single package. According to an embodiment, the first RFFE 232 and the second RFFE 234 may be implemented as at least part of a single chip or a single package. According to an embodiment, at least one antenna module of the first antenna module 242 or the second antenna module 244 may be omitted or may be coupled to another antenna module and then may process RF signals of a plurality of corresponding bands.

According to an embodiment, the third RFIC 226 and the antenna 248 may be disposed on the same substrate to form a third antenna module 246. For example, the wireless communication module 192 or the processor 120 may be disposed on a first substrate (e.g., a main PCB). In this case, the third RFIC 226 may be disposed in a partial region (e.g., a bottom surface) of a second substrate (e.g., sub PCB) separately of the first substrate; the antenna 248 may be disposed in another partial region (e.g., an upper surface), and thus the third antenna module 246 may be formed. According to an embodiment, the antenna 248 may include, for example, an antenna array capable of being used for beamforming. As the third RFIC 226 and the antenna 248 are disposed at the same substrate, it may be possible to decrease a length of a transmission line between the third RFIC 226 and the antenna 248. For example, the decrease in the transmission line may make it possible to prevent and/or reduce a signal in a high-frequency band (e.g., approximately 6 GHz to approximately 60 GHz) used for the 5G network communication from being lost (or attenuated) due to the transmission line. As such, the electronic device 101 may improve the quality or speed of communication with the second cellular network 294 (e.g., a 5G network).

The second cellular network 294 (e.g., a 5G network) may be used independently of the first cellular network 292 (e.g., a legacy network) (e.g., this scheme being called "stand-alone (SA)") or may be used in connection with the first cellular network 292 (e.g., this scheme being called "non-stand alone (NSA)"). For example, only an access network (e.g., a 5G radio access network (RAN) or a next generation RAN (NG RAN)) may be present in the 5G network, and a core network (e.g., a next generation core (NGC)) may be absent from the 5G network. In this case, the electronic device 101 may access the access network of the 5G network and may then access an external network (e.g., Internet) under control of a core network (e.g., an evolved packed core (EPC)) of the legacy network. Protocol information (e.g., LTE protocol information) for communication with the legacy network or protocol information (e.g., New Radio (NR) protocol information) for communication with the 5G network may be stored in the memory 130 so as to be accessed by any other component (e.g., the processor 120, the first communication processor 212, or the second communication processor 214).

Figure 3:
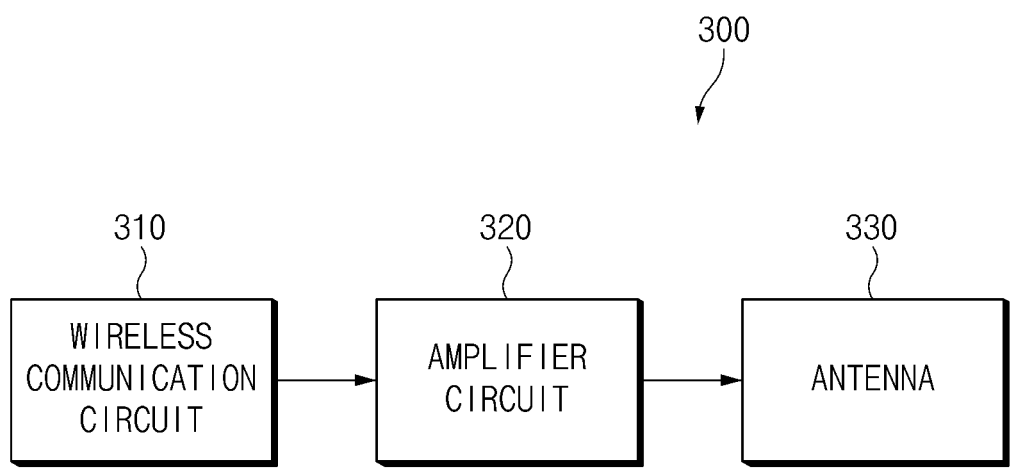
FIG. 3 is a block diagram illustrating an example configuration of an electronic device according to various embodiments.

FIG. 3 is a block diagram illustrating an example configuration of an electronic device 300 according to various embodiments.

Referring to FIG. 3, the electronic device 300 (e.g., an electronic device 101) may include a wireless communication circuit 310, an amplifier circuit 320, and/or an antenna 330. At least one or more other components included in the electronic device 101 of FIG. 1 may be added to the electronic device 300.

According to an embodiment, the wireless communication circuit 310 may generate an RF signal necessary for communication. For example, the wireless communication circuit 310 may generate wideband RF signals. The wireless communication circuit 310 may generate RF signals having a specific bandwidth difference (e.g., 60 MHz, 100 MHz, or 400 MHz). For another example, the wireless communication circuit 310 may generate RF signals using a plurality of frequencies included in one frequency band (e.g., a frequency band with a large bandwidth). The amplifier circuit 320 according to an embodiment may stably amplify various signals, each of which is changed in impedance according to a change in frequency of an input signal and has a different bandwidth, or signals, each of which is included in one frequency band and has a different frequency. The amplifier circuit 320 may amplify and deliver the received RF signal to the antenna 330. The amplified RF signal may be transmitted through the antenna 330.

According to an embodiment, the amplifier circuit 320 may include, for example, a Doherty amplifier structure. For example, the amplifier circuit 320 may include two amplifiers (e.g., a main (or carrier) amplifier and an auxiliary (or peak) amplifier). An output terminal of the main amplifier may be connected with a first transmission line, and an output terminal of the auxiliary amplifier may be connected with a second transmission line. For example, the first transmission line and the second transmission line may be connected with each other to form one output node. The antenna 330 may be connected with the output node. In an embodiment, a variable impedance circuit (e.g., a λ/4 impedance line) may be disposed on the first transmission line. In an embodiment, the variable impedance circuit may include a switch (e.g., a MEMS switch). For example, an impedance value of the variable impedance circuit may be determined under control of the switch. The wireless communication circuit 310 may control the switch depending on a frequency of the RF signal delivered from the wireless communication circuit 310 to the amplifier circuit 320. For example, as the switch is controlled, an impedance value of the variable impedance circuit may be changed. For example, the amplifier circuit 320 may be set according to frequencies of the changed RF signals. The amplifier circuit 320 may process wideband RF signals.

Figure 4:
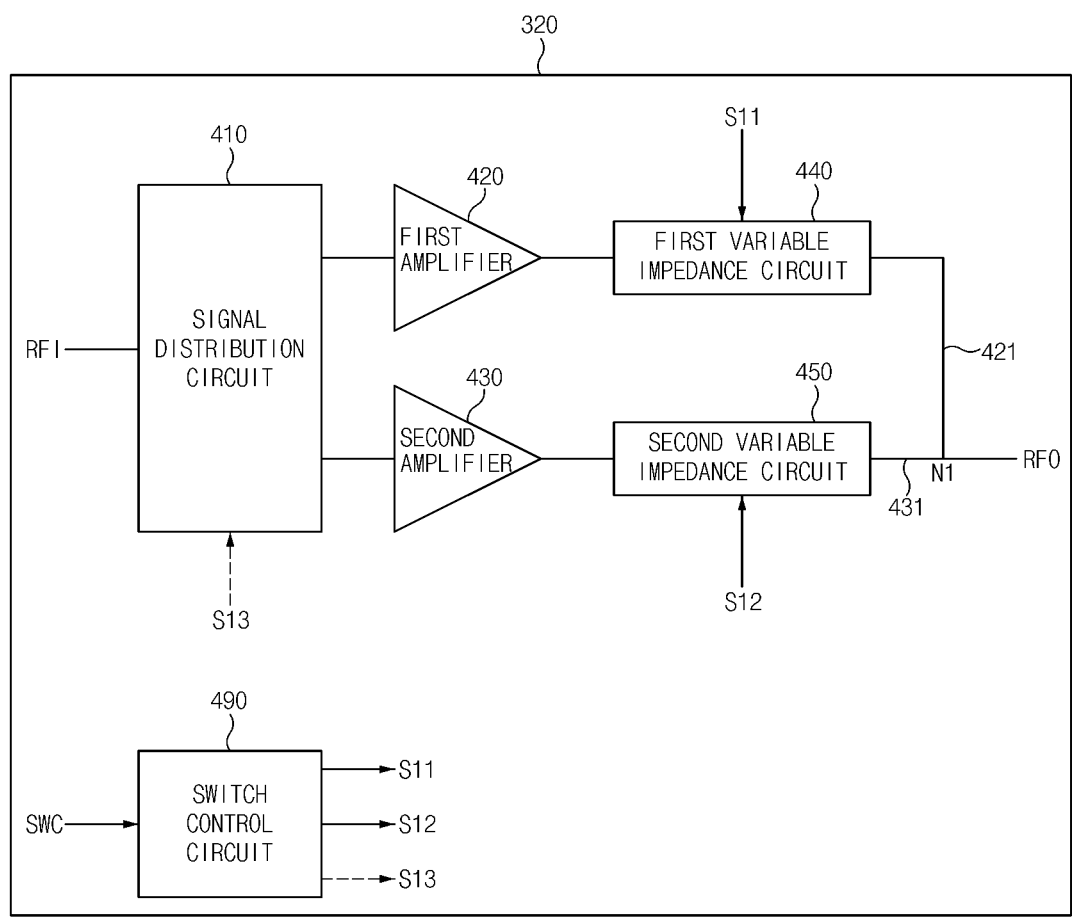
FIG. 4 is a diagram illustrating an example of an amplifier circuit of FIG. 3 according to various embodiments.
Figure 5A:
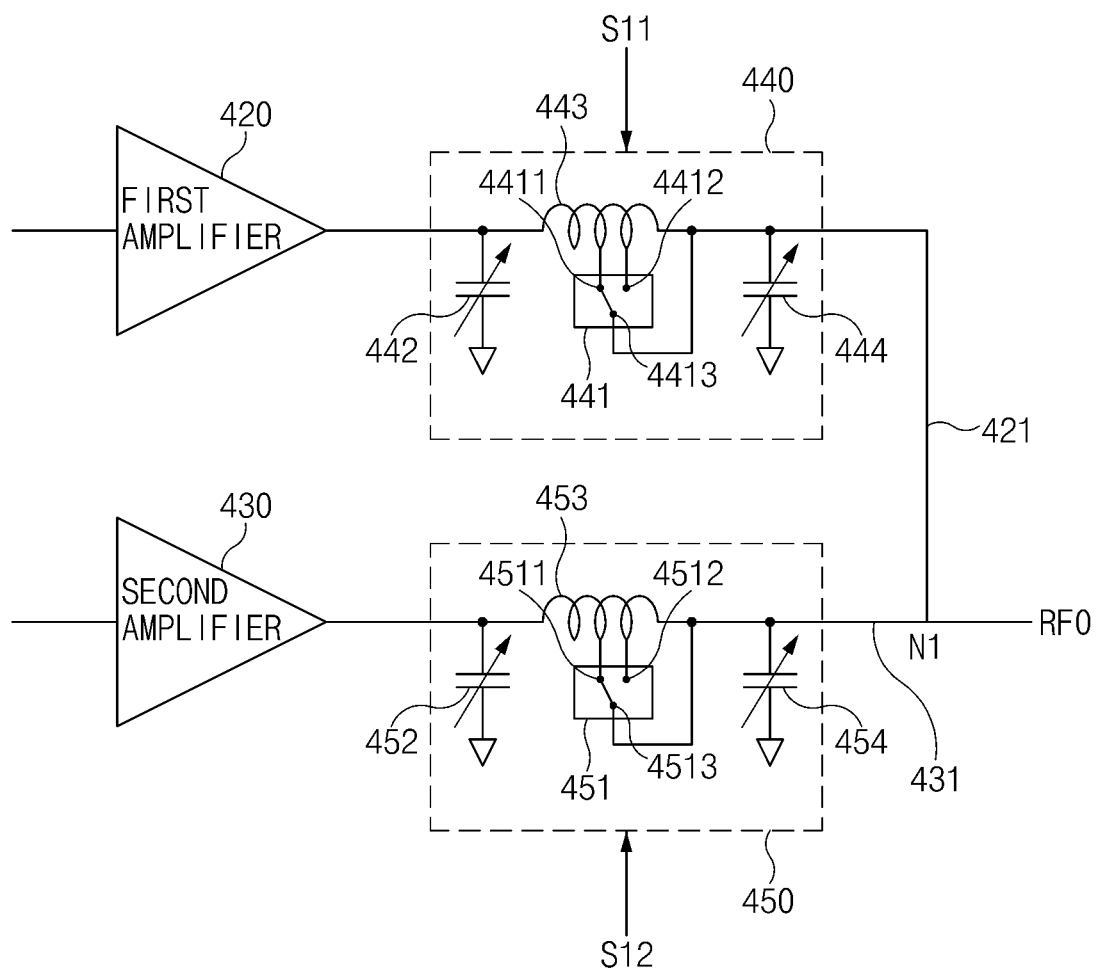
FIG. 5A is a diagram illustrating a first variable impedance circuit and a second variable impedance circuit of FIG. 4 according to various embodiments.
Figure 5B:
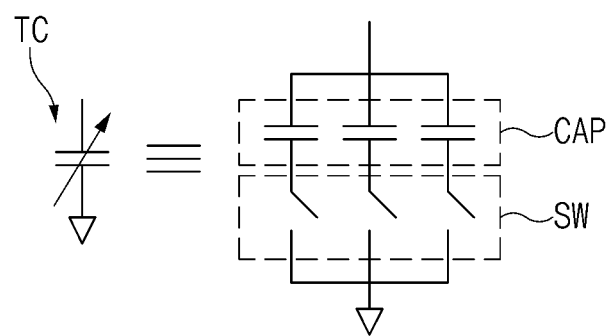
FIG. 5B is a diagram illustrating an equivalent circuit of a variable capacitor according to various embodiments.
Figure 6:
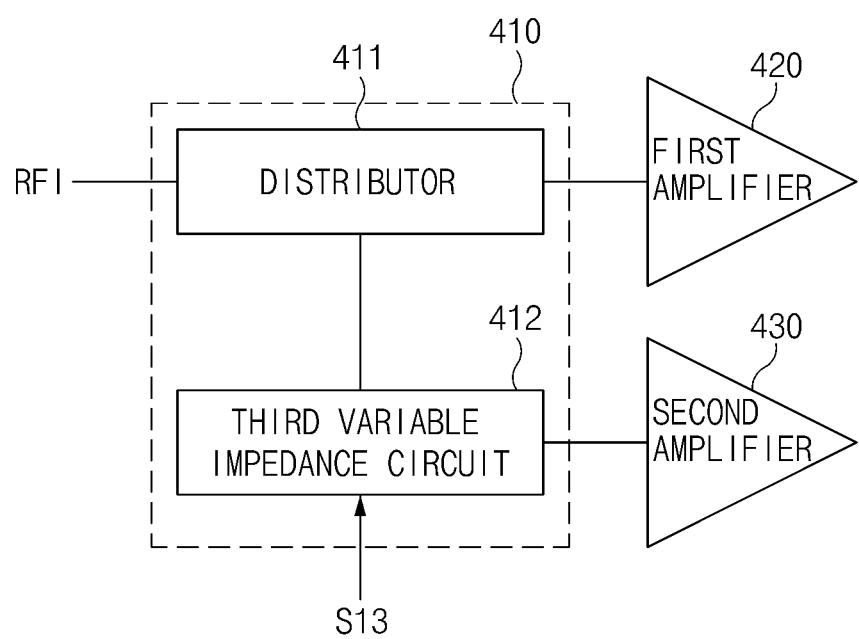
FIG. 6 is a diagram illustrating an example of a signal distribution circuit of FIG. 4 according to various embodiments.

FIG. 4 is a diagram illustrating an example of an amplifier circuit of FIG. 3 according to various embodiments. FIG. 5A is a diagram illustrating a first variable impedance circuit and a second variable impedance circuit of FIG. 4 according to various embodiments. FIG. 5B is a diagram illustrating an equivalent circuit of a variable capacitor according to various embodiments. FIG. 6 is a diagram illustrating an example of a signal distribution circuit of FIG. 4 according to various embodiments.

Referring to FIG. 4, an amplifier circuit 320 may include a signal distribution circuit 410, a first amplifier 420, a second amplifier 430, a first variable impedance circuit 440, a second variable impedance circuit 450, and/or a switch control circuit 490. According to an embodiment, the amplifier circuit 320 may include, for example, a Doherty amplifier structure. For example, the first amplifier 420 may serve as a main amplifier or a carrier amplifier. The second amplifier 430 may serve as an auxiliary amplifier or a peak amplifier. At a first node N1, load impedance may be set to reference impedance (e.g., 50Ω). The load impedance may be determined by synthesizing an impedance value of the first variable impedance circuit 440 with an impedance value of the second variable impedance circuit 450. The first amplifier 420 may be turned on irrespective of a low or high power situation. The second amplifier 430 may be turned on in the high power situation and may be turned off in the low power situation.

According to an embodiment, the signal distribution circuit 410 may receive and distribute an input signal RFI from a wireless communication circuit 310 of FIG. 3 to the first amplifier 420 and/or the second amplifier 430. For example, the signal distribution circuit 410 may transmit a first distribution signal to the first amplifier 420 and may transmit a second distribution signal to the second amplifier 430. The first distribution signal and the second distribution signal may have a phase difference of 90 degrees.

According to an embodiment, the first amplifier 420 may be connected with the first node N1. For example, an output terminal of the first amplifier 420 may be connected with the first node N1 through the first transmission line 421 (e.g., a first transmission path). The first variable impedance circuit 440 may be disposed on the first transmission line 421. As an example, the first variable impedance circuit 440 may include a first impedance line (e.g., a λ/4 impedance line) or a first switch (e.g., a MEMS switch) connected with the first impedance line. In an embodiment, the first variable impedance circuit 440 may change an impedance value based on a first switch signal S11. For example, the first switch may adjust an electrical length where a signal passes through the first impedance line based on the first switch signal S11.

According to an embodiment, the second amplifier 430 may be connected with the first node N1. For example, an output terminal of the second amplifier 430 may be connected with the first node N1 through the second transmission line 431 (e.g., a second transmission path). The second variable impedance circuit 450 may be disposed on the second transmission line 431. As an example, the second variable impedance circuit 450 may include a second impedance line (e.g., an offset impedance line) or a second switch (e.g., a MEMS switch) connected with the second impedance line. In an embodiment, the second variable impedance circuit 450 may change an impedance value based on a second switch signal S12. For example, the second switch may adjust an electrical length where a signal passes through the second impedance line based on the second switch signal S12.

According to an embodiment, an output signal of the first variable impedance circuit 440 and an output signal of the second variable impedance circuit 450 may be synthesized with each other to form an output signal RFO.

According to an embodiment, the switch control circuit 490 may output the first switch signal S11 and/or the second switch signal S12 based on a switch control signal SWC. For another example, the switch control circuit 490 may output a third switch signal S13. For example, the wireless communication circuit 310 may transmit an input signal RFI to the signal distribution circuit 410. The wireless communication circuit 310 may transmit the switch control signal SWC corresponding to a frequency of the input signal RFI to the switch control circuit 490. The switch control circuit 490 may output the first switch signal S11, the second switch signal S12, and/or the third switch signal S13 based on the switch control signal SWC. In an embodiment, impedance values of the first variable impedance circuit 440 and/or the second variable impedance circuit 450 may be determined (or changed) based on the frequency of the input signal RFI. The amplifier circuit 320 may support a wideband frequency. As various embodiments, the switch control circuit 490 may store a lookup table defining the first switch signal S11, the second switch signal S12, or the third switch signal S13 corresponding to the switch control signal SWC.

According to an embodiment, referring to FIG. 5A, the first variable impedance circuit 440 or the second variable impedance circuit 450 may be formed (e.g., Pi-matching) by means of an inductor and/or a capacitor. For example, the first variable impedance circuit 440 may include a first inductor 443, a first capacitor 442, a second capacitor 444, and/or a first switch 441. The first inductor 443 may be located on a path between the output terminal of the first amplifier 420 and the first node N1. One end of the first capacitor 442 may be connected with a path between the output terminal of the first amplifier 420 and the first inductor 443, and the other end of the first capacitor 442 may be connected with the ground. One end of the second capacitor 444 may be connected with a path between the first node N1 and the first inductor 443, and the other end of the second capacitor 444 may be connected with the ground. The first capacitor 442 or the second capacitor 444 may be formed as a variable capacitor TC. For example, referring to FIG. 5B, the variable capacitor TC may be implemented as one variable capacitor or may be implemented as a combination of a plurality of fixed capacitors CAP and at least one switch SW (e.g., a MEMS switch).

According to an embodiment, the first switch 441 may include a plurality of terminals (e.g., a first terminal 4411, a second terminal 4412, or a third terminal 4413). For example, the first switch 441 may include a MEMS switch. The first terminal 4411 of the first switch 441 may be connected with a first portion of the first inductor 443. The second terminal 4412 of the first switch 441 may be connected with a second portion of the first inductor 443. The third terminal 4413 of the first switch 441 may be connected with the first node N1. For example, the third terminal 4413 of the first switch 441 may be connected with a path between the first inductor 443 and the second capacitor 444 to be connected with the first node N1. According to an embodiment, based on a first switch signal S11, the third terminal 4413 of the first switch 441 may be connected with the first terminal 4411 of the first switch 441 or the second terminal 4412 of the first switch 441 or may not connected with any terminal to be opened. For example, according to the first switch signal S11 (or according to a frequency of the input signal RFI), an impedance value of the first variable impedance circuit 440 may be varied to first impedance, second impedance, or third impedance. For example, the impedance value of the first variable impedance circuit 440 may be set (or changed) according to the frequency of the input signal RFI as shown in Table 1. According to an embodiment, the first impedance may correspond to a λ/4 impedance value of a first frequency A1. The second impedance may correspond to a λ/4 impedance value of a second frequency A2. The third impedance may correspond to a λ/4 impedance value of a third frequency A3. The switch control circuit 490 may store a lookup table as shown in Table 1 and may generate the first switch signal S11 based on the switch control signal SWC. The configuration of the first switch 441 described herein is illustrative. The first switch 441 may further include an additional switch terminal, and the impedance value of the first variable impedance circuit 440 may be more variously set. The lookup table as shown in Table 1 may be stored in, for example, a memory (e.g., a memory 130 of FIG. 1) included in the electronic device 101, as well as the switch control circuit 490.

TABLE 1

| Frequency of input signal RFI | Switch control signal SWC | First switch signal S11 | Impedance value of first variable impedance circuit 440 |
|---|---|---|---|
| A1 | a1 | sa1 | First impedance |
| A2 | a2 | sa2 | Second impedance |
| A3 | a3 | sa3 | Third impedance |

According to various embodiments, the first capacitor 442 or the second capacitor 444 may also include a switch (e.g., a MEMS switch) which is the same as or similar to the first switch 441. A capacitance value of the first capacitor 442 or the second capacitor 444 may also be set (or changed) based on the frequency of the input signal RFI (or based on the first switch signal S11).

According to an example embodiment a second variable impedance circuit may include a first inductor 453, a first capacitor 452, a second capacitor 454, and/or a first switch 451. According to an embodiment, the second switch 451 may include a plurality of terminals (e.g., a first terminal 4511, a second terminal 4512, or a third terminal 4513). For example, the second switch 451 may include a MEMS switch. The second switch 451 may be formed to be the same as or similar to the first switch 441 in the second variable impedance circuit 450. Based on the second switch signal S12, the third terminal 4513 of the second switch 451 may be connected with the first terminal 4511 of the second switch 441 or the second terminal 4512 of the second switch 451 or may not connected with any terminal to be opened. For example, according to the second switch signal S12 (or according to the frequency of the input signal RFI), an impedance value of the second variable impedance circuit 450 may be varied to fourth impedance, fifth impedance, or sixth impedance. For example, the second variable impedance circuit 450 may operate as output offset impedance corresponding to the first variable impedance circuit 440. According to an embodiment, the fourth impedance may correspond to an output offset impedance value of the first frequency A1. The fifth impedance may correspond to an output offset impedance value of the second frequency A2. The sixth impedance may correspond to an output offset impedance value of the third frequency A3. According to an embodiment, the output offset impedance of the second variable impedance circuit 450 may be determined in response to λ/4 impedance of the first variable impedance circuit 440.

According to an embodiment, referring to FIG. 6, the signal distribution circuit 410 may include a distributor 411 and/or a third variable impedance circuit 412. For example, the distributor 411 may include a wideband distributor. The distributor 411 may distribute RF signals of various frequencies. In an embodiment, the third variable impedance circuit 412 may operate as input offset impedance corresponding to the first variable impedance circuit 440. For example, the third variable impedance circuit 412 may be set to λ/4 impedance corresponding to the frequency of the input signal RFI. According to various embodiments, the third variable impedance circuit 412 may be formed to be the same as or similar to the first variable impedance circuit 440. The third variable impedance circuit 412 may include a third switch (e.g., a MEMS switch) which is the same as or similar to the first switch 441. The third switch may operate based on the third switch signal S13. The impedance value of the third variable impedance circuit 412 may be set (or changed) based on an operation of the third switch signal S13. The switch control circuit 490 may generate the third switch signal S13 based on the switch control signal SWC corresponding to the frequency of the input signal RFI.

Figure 7:
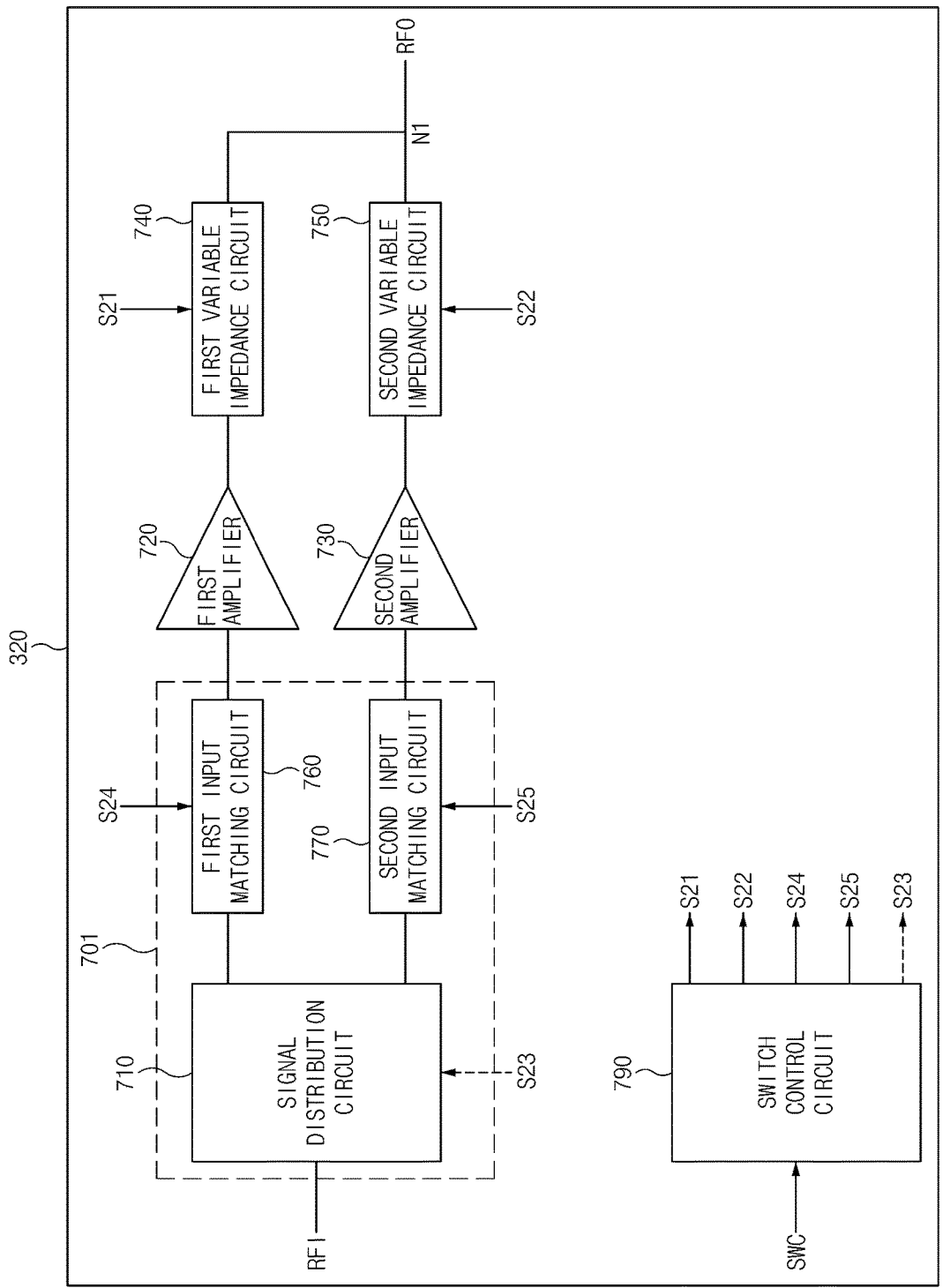
FIG. 7 is a diagram illustrating another example of an amplifier circuit of FIG. 3 according to various embodiments.
Figure 8:
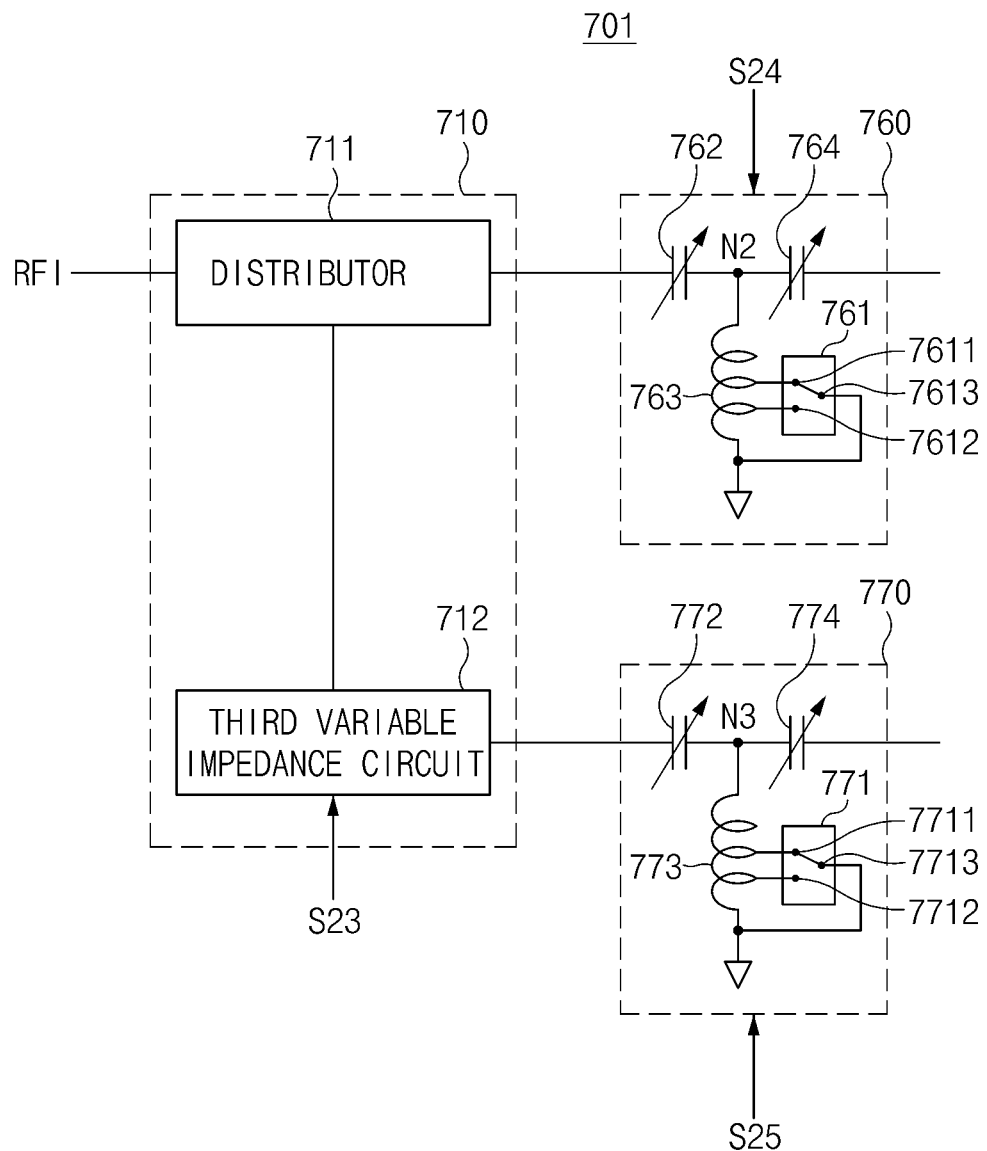
FIG. 8 is a diagram illustrating an example of an input circuit of FIG. 7 according to various embodiments.
Figure 9:
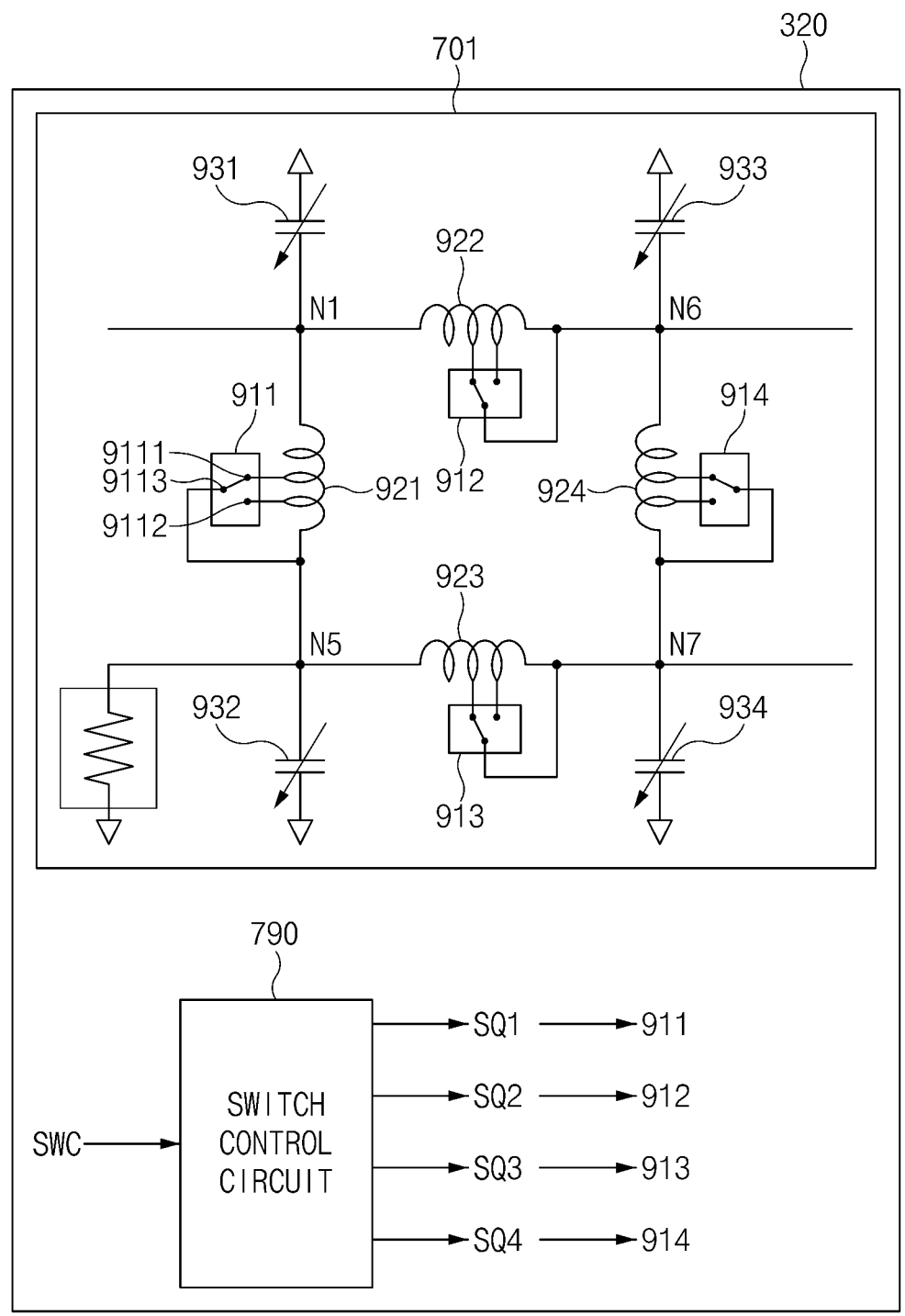
FIG. 9 is a diagram illustrating another example of an input circuit of FIG. 7 according to various embodiments.

FIG. 7 is a diagram illustrating another example of an amplifier circuit of FIG. 3 according to various embodiments. FIG. 8 is a diagram illustrating an example of an input circuit of FIG. 7 according to various embodiments. FIG. 9 is a diagram illustrating another example of an input circuit of FIG. 7.

Referring to FIG. 7, an amplifier circuit 320 may include an input circuit 701, a first amplifier 720, a second amplifier 730, a first variable impedance circuit 740, a second variable impedance circuit 750, and/or a switch control circuit 790.

According to an embodiment, the input circuit 701 may include a signal distribution circuit 710, a first input matching circuit 760, and/or a second input matching circuit 770. According to an embodiment, the amplifier circuit 320 may include, for example, a Doherty amplifier structure. Configurations and operations of the signal distribution circuit 710, the first amplifier 720, the second amplifier 730, the first variable impedance circuit 740, the second variable impedance circuit 750, and the switch control circuit 790 are the same as or similar to configurations and operations of a signal distribution circuit 410, a first amplifier 420, a second amplifier 430, a first variable impedance circuit 440, a second variable impedance circuit 450, and a switch control circuit 490 of FIG. 4, and a description of the same or similar portion will be omitted. According to an embodiment, the switch control circuit 790 may generate a first switch signal S21, a second switch signal S22, a third switch signal S23, a fourth switch signal S24, or a fifth switch signal S25 based on a switch control signal SWC (or based on a frequency of an input signal RFI).

According to an embodiment, referring to FIG. 8, the input circuit 701 may include a signal distribution circuit 710, a first input matching circuit 760, and/or a second input matching circuit 770. For example, the signal distribution circuit 710 may include a distributor 711 and/or a third variable impedance circuit 712. Because configurations and operations of the distributor 711 and the third variable impedance circuit 712 are the same as or similar to configurations and operations of a distributor 411 and a third variable impedance circuit 412 of FIG. 6, a description thereof will be omitted.

According to an embodiment, the first input matching circuit 760 may be used for impedance matching between a wireless communication circuit 310 (refer to FIG. 3) and the first amplifier 720. The second input matching circuit 770 may be used for impedance matching between the wireless communication circuit 310 and the second amplifier 730. For example, an impedance value of the first input matching circuit 760 and/or an impedance value of the second input matching circuit 770 may be varied based on the frequency of the input signal RFI. For example, the first input matching circuit 760 may include a fifth capacitor 762, a sixth capacitor 764, a third inductor 763, and/or a fourth switch 761. The fifth capacitor 762 may be located on a path between an output terminal of the distributor 711 and a second node N2. The sixth capacitor 764 may be located on a path between the second node N2 and an input terminal of the first amplifier 720. The third inductor 763 may be located on a path between the second node N2 and the ground terminal. The fifth capacitor 762 or the sixth capacitor 764 may be formed as, for example, a variable capacitor.

According to an embodiment, the fourth switch 761 may include a plurality of terminals (e.g., a first terminal 7611, a second terminal 7612, or a third terminal 7613). For example, the fourth switch 761 may include a MEMS switch. The first terminal 7611 of the fourth switch 761 may be connected with a first portion of the third inductor 763. The second terminal 7612 of the fourth switch 761 may be connected with a second portion of the third inductor 763. The third terminal 7613 of the fourth switch 761 may be connected with the ground terminal. In an embodiment, based on a fourth switch signal S24, the third terminal 7613 of the fourth switch 441 may be connected with the first terminal 7611 of the fourth switch 761 or the second terminal 7612 of the fourth switch 761 or may not connected with any terminal to be opened. For example, according to the fourth switch signal S24, an impedance value of the first input matching circuit 760 may be varied to an impedance value corresponding to the frequency of the input signal RFI. The configuration of the fourth switch 761 described herein is illustrative. The fourth switch 761 may further include an additional switch terminal, and the impedance value of the first input matching circuit 760 may be more variously set.

As various embodiments, the second input matching circuit 770 may include a seventh capacitor 772, an eighth capacitor 774, a fourth inductor 773, and/or a fifth switch 771. For example, configurations and operations of the seventh capacitor 772, the eighth capacitor 774, the fourth inductor 773, and the fifth switch 771 (e.g., including a first terminal 7711, a second terminal 7712, or a third terminal 7713) are the same as or similar to configurations and operations of the fifth capacitor 762, the sixth capacitor 764, the third inductor 763, and the fourth switch 761, a description of the same or similar portion will be omitted.

According to various embodiments, the fifth capacitor 762, the sixth capacitor 764, the seventh capacitor 772, or the eighth capacitor 774 may also include a switch (e.g., a MEMS switch) which is the same as or similar to the fourth switch 761. A capacitance value of the fifth capacitor 762, the sixth capacitor 764, the seventh capacitor 772 or the eighth capacitor 774 may also be set (or changed) based on the frequency of the input signal RFI (or based on the fourth switch signal S24 or the fifth switch signal S25).

As various embodiments, referring to FIG. 9, the input circuit 701 may include a plurality of inductors and a plurality of capacitors. For example, the input circuit 701 may be formed as a quadrature generator. The input circuit 701 may include a fifth inductor 921, a sixth inductor 922, a seventh inductor 923, an eighth inductor 924, a ninth capacitor 931, a tenth capacitor 932, an eleventh capacitor 933, a twelfth capacitor 934, a sixth switch 911, a seventh switch 912, an eighth switch 913, and/or a ninth switch 914. For example, the ninth capacitor 931, the tenth capacitor 932, the eleventh capacitor 933, or the twelfth capacitor 934 may include a variable capacitor. The fifth inductor 921 may be located on a path between a fourth node N5 and a fifth node N5. The sixth inductor 922 may be located on a path between the fourth node N4 and a sixth node N6. The seventh inductor 923 may be located on a path between the fifth node N5 and a seventh node N7. The eighth inductor 924 may be located on a path between the sixth node N6 and the seventh node N7. The ninth capacitor 931 may be located on a path between the fourth node N4 and the ground terminal. The tenth capacitor 932 may be located on a path between the fifth node N5 and the ground terminal. The eleventh capacitor 933 may be located on a path between the sixth node N6 and the ground terminal. The twelfth capacitor 934 may be located on a path between the seventh node N7 and the ground terminal. The input signal RFI may be input to the fourth node N4. The fifth node N5 may be connected with the ground terminal. As an example, a specific resistor may be located on a path between the fifth node N5 and the ground terminal. The sixth node N6 may be connected with an input terminal of the first amplifier 720. The seventh node N7 may be connected with an input terminal of the second amplifier 730. RF signals output to the sixth node N6 and the seventh node N7 may have a phase difference of a specific magnitude (e.g., 90 degrees).

According to an embodiment, the sixth switch 911 may include a plurality of terminals (e.g., a first terminal 9111, a second terminal 9112, or a third terminal 9113). For example, the sixth switch 911 may include a MEMS switch. The first terminal 9111 of the sixth switch 911 may be connected with a first portion of the fifth inductor 921. The second terminal 9112 of the sixth switch 911 may be connected with a second portion of the fifth inductor 921. The third terminal 9113 of the sixth switch 911 may be connected with a path between the fifth node N5 and the fifth inductor 921. Based on a sub-switch signal SQ1, the third terminal 9113 of the sixth switch 911 may be connected with the first terminal 9111 of the sixth switch 911 or the second terminal 9112 of the sixth switch 911 or may not connected with any terminal to be opened. The configuration of the sixth switch 911 described herein is illustrative. The sixth switch 911 may further include an additional switch terminal. The seventh switch 912 may be connected with the sixth inductor 922 to be the same as or similar to the sixth switch 911. The eighth switch 913 may be connected with the seventh inductor 923 to be the same as or similar to the sixth switch 911. The ninth switch 914 may be connected with the eighth inductor 924 to be the same as or similar to the sixth switch 911.

According to an embodiment, the switch control circuit 790 may generate a first sub-switch signal SQ1, a second sub-switch signal SQ2, a third sub-switch signal SQ3, and/or a fourth sub-switch signal SQ4 based on the switch control signal SWC. For example, the first sub-switch signal SQ1 may be transmitted to the sixth switch 911. The second sub-switch signal SQ2 may be transmitted to the seventh switch 912. The third sub-switch signal SQ3 may be transmitted to the eighth switch 913. The fourth sub-switch signal SQ4 may be transmitted to the ninth switch 914. The sixth switch 911, the seventh switch 912, the eighth switch 913, and/or the ninth switch 914 may be set based on the frequency of the input signal RFI. Thus, the input circuit 701 may output two RF signals, impedance matching of which is performed in response to the frequency of the input signal RFI.

Figure 10:
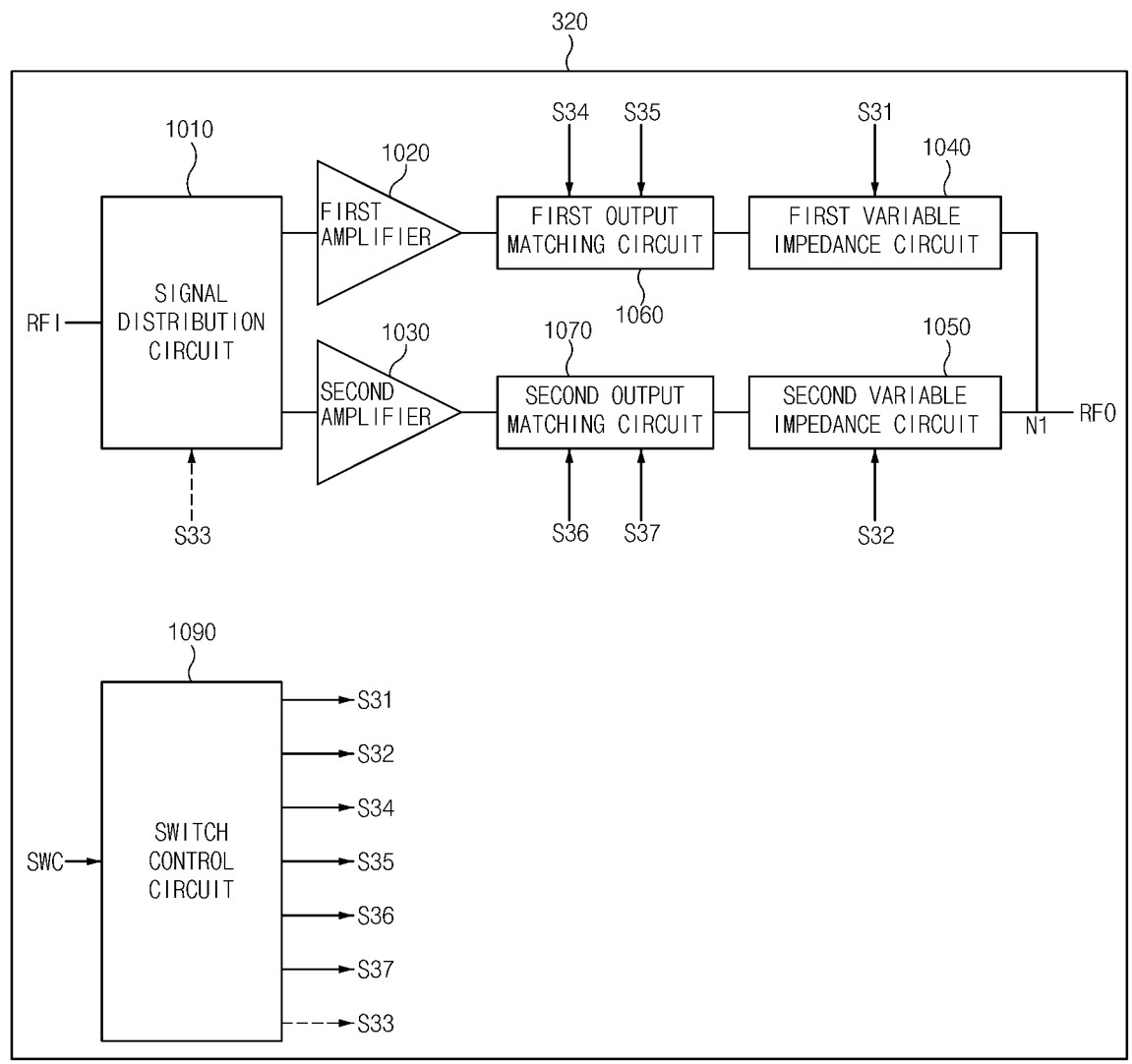
FIG. 10 is a diagram illustrating another example of an amplifier circuit of FIG. 3 according to various embodiments.
Figure 11:
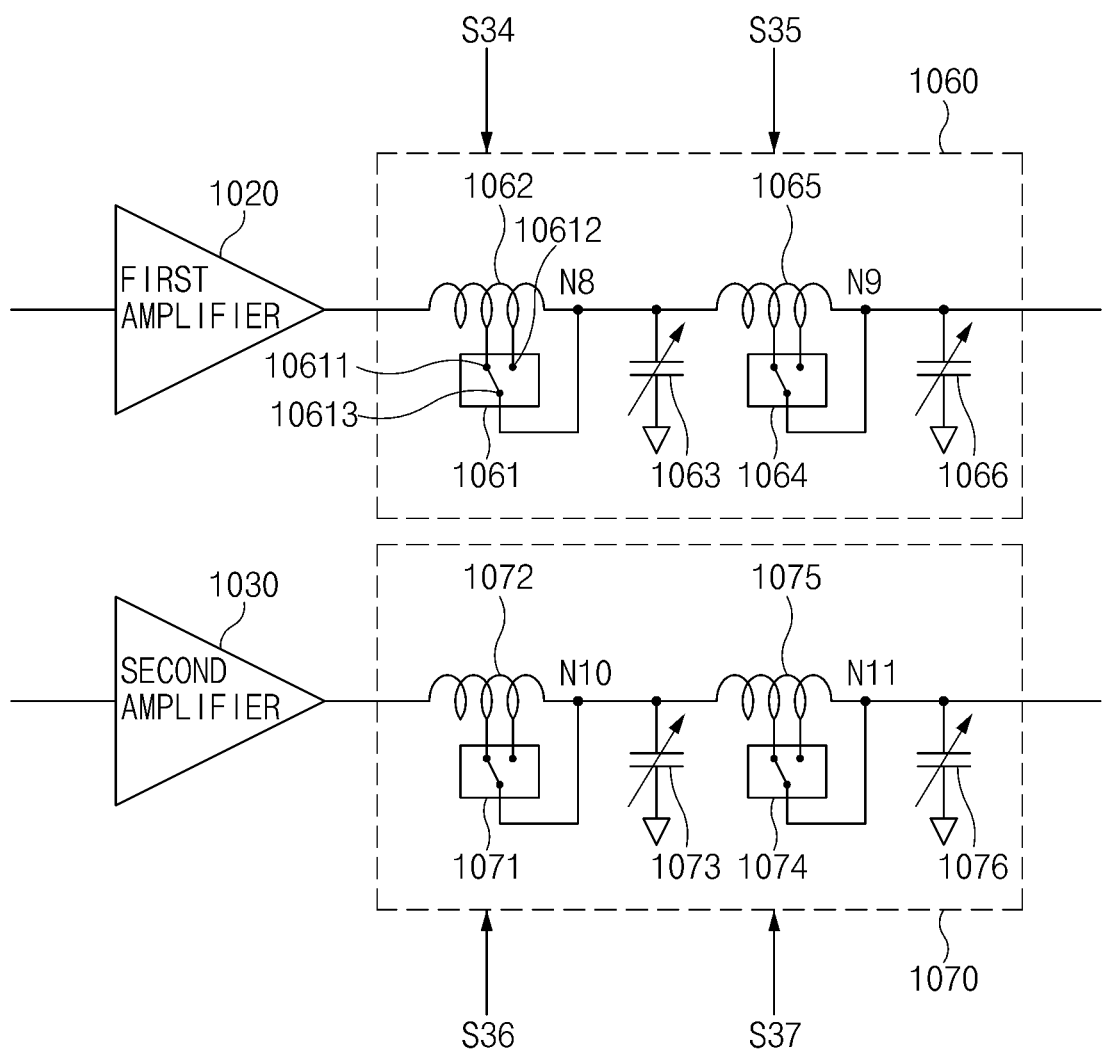
FIG. 11 is a diagram illustrating an example of a first output matching circuit and a second output matching circuit of FIG. 10 according to various embodiments.

FIG. 10 is a diagram illustrating another example of an amplifier circuit of FIG. 3 according to various embodiments. FIG. 11 is a diagram illustrating an example of a first output matching circuit and a second output matching circuit of FIG. 10 according to various embodiments.

Referring to FIG. 10, an amplifier circuit 320 may include a signal distribution circuit 1010, a first amplifier 1020, a second amplifier 1030, a first output matching circuit 1060, a second output matching circuit 1070, a first variable impedance circuit 1040, a second variable impedance circuit 1050, and/or a switch control circuit 1090. According to an embodiment, the amplifier circuit 320 may include a Doherty amplifier structure. Configurations and operations of the signal distribution circuit 1010, the first amplifier 1020, the second amplifier 1030, the first variable impedance circuit 1040, the second variable impedance circuit 1050, and the switch control circuit 1090 are the same as or similar to configurations and operations of a signal distribution circuit 410, a first amplifier 420, a second amplifier 430, a first variable impedance circuit 440, a second variable impedance circuit 450, and a switch control circuit 490 of FIG. 4, and a description of the same or similar portion will be omitted. According to an embodiment, the switch control circuit 1090 may generate a first switch signal S31, a second switch signal S32, a third switch signal S33, a fourth switch signal S34, a fifth switch signal S35, a sixth switch signal S36, or a seventh switch signal S37 based on a switch control signal SWC (or based on a frequency of an input signal RFI).

According to an embodiment, referring to FIG. 11, the first output matching circuit 1060 may be used for output matching of the first amplifier 1020. The second output matching circuit 1070 may be used for output matching of the second amplifier 1030. For example, the first output matching circuit 1060 may be located on a path between the first amplifier 1020 and the first variable impedance circuit 1040. The second output matching circuit 1070 may be located on a path between the second amplifier 1030 and the second variable impedance circuit 1050. An impedance value of the first input matching circuit 1060 and/or an impedance value of the second input matching circuit 1070 may be varied based on the frequency of the input signal RFI.

According to an embodiment, the first output matching circuit 1060 may include a ninth inductor 1062, a thirteenth capacitor 1063, a tenth inductor 1065, a fourteenth capacitor 1066, a tenth switch 1061, and an eleventh switch 1064. For example, the ninth inductor 1062 may be located on a path between an output terminal of the first amplifier 1020 and an eighth node N8. The thirteenth capacitor 1063 may be located on a path between a path between the eighth node N8 and the tenth inductor 1065 and the ground terminal. The tenth inductor 1065 may be located on a path between the eighth node N8 and a ninth node N9. The fourteenth capacitor 1066 may be located on a path between a path between the ninth node N9 and an input terminal of the first variable impedance circuit 1040 and the ground terminal. The ninth node N9 may be located on a path between the input terminal of the first variable impedance circuit 1040.

According to an embodiment, the tenth switch 1061 may include a plurality of terminals (e.g., a first terminal 10611, a second terminal 10612, or a third terminal 10613). For example, the tenth switch 1061 may include a MEMS switch. The first terminal 10611 of the tenth switch 1061 may be connected with a first portion of the ninth inductor 1062. The second terminal 10612 of the tenth switch 1061 may be connected with a second portion of the ninth inductor 1062. The third terminal 10613 of the tenth switch 1061 may be connected with the eighth node N8. In an embodiment, based on a fourth switch signal S34, the third terminal 10613 of the tenth switch 1061 may be connected with the first terminal 10611 of the tenth switch 1061 or the second terminal 10612 of the tenth switch 1061 or may not connected with any terminal to be opened. For example, according to the fourth switch signal S34, an impedance value of the first output matching circuit 1060 may be varied to an impedance value corresponding to the frequency of the input signal RFI. The configuration of the tenth switch 1061 described herein is illustrative. The tenth switch 1061 may further include an additional switch terminal, and the impedance value of the first output matching circuit 1060 may be more variously set. According to an embodiment, the configuration and operation of the eleventh switch 1064 is the same as or similar to the configuration and operation of the tenth switch 1061, a description of the same or similar portion will be omitted.

According to an embodiment, the second output matching circuit 1070 may include an eleventh inductor 1072, a fifteenth capacitor 1073, a twelfth inductor 1075, a sixteenth capacitor 1076, a twelfth switch 1071, and a thirteenth switch 1074. For example, the eleventh inductor 1072 may be located on a path between an output terminal of the second amplifier 1030 and a tenth node N10. The fifteenth capacitor 1073 may be located on a path between the tenth node N10 and the ground terminal. The twelfth inductor 1075 may be located on a path between the tenth node N10 and an eleventh node N11. The sixteenth capacitor 1076 may be located on a path between the eleventh node N11 and the ground terminal. The eleventh node N11 may be located on a path between the twelfth inductor 1075 and the input terminal of the second variable impedance circuit 1050. According to an embodiment, the configurations and operations of the twelfth switch 1071 and the thirteenth switch 1074 are the same as or similar to the configuration and operation of the tenth switch 1061, a description of the same or similar portion will be omitted.

According to an embodiment, the tenth switch 1061 may operate based on the fourth switch signal S34. The eleventh switch 1064 may operate based on the fifth switching signal S35. The twelfth switch 1071 may operate based on the sixth switching signal S36. The thirteenth switch 1074 may operate based on the seventh switching signal S37. The fourth switch signal S34, the fifth switch signal S35, the sixth switch signal S36, and/or the seventh switch signal S37 may be generated by the switch control circuit 1090 based on the switch control signal SWC. The switch control signal SWC may be generated by a wireless communication circuit 310 based on the frequency of the input signal RFI.

According to various embodiments, the thirteenth capacitor 1063, the fourteenth capacitor 1066, the fifteenth capacitor 1073, or the sixteenth capacitor 1076 may include a switch (e.g., a MEMS switch) which is the same as or similar to the tenth switch 1061. A capacitance value of the thirteenth capacitor 1063, the fourteenth switch 1066, the fifteenth switch 1073, or the sixteenth switch 1076 may be set based on the frequency of the input signal RFI. The first output matching circuit 1060 and/or the second output matching circuit 1070 may match output impedance of the first amplifier 1020 and/or second amplifier 1030 based on the frequency of the input signal RFI and may operate for a wideband RF signal.

According to various example embodiments, an electronic device (e.g., an electronic device 101 or 300) may include: a wireless communication circuit (e.g., a wireless communication circuit 310) configured to generate an RF signal (e.g., an input signal RFI), an amplifier circuit (e.g., an amplifier circuit 320) electrically connected with the wireless communication circuit and configured to amplify the RF signal, and an antenna (e.g., an antenna 330) connected with the amplifier circuit. The amplifier circuit may include a first amplifier (e.g., a first amplifier 420), a second amplifier (e.g., a second amplifier 430), a first transmission path (e.g., a first transmission line 421) connected with an output terminal of the first amplifier and the antenna, a second transmission path (e.g., a second transmission line 431) connected with an output terminal of the second amplifier and the first transmission path, a first variable impedance circuit (e.g., a first variable impedance circuit 440) located on the first transmission path and configured to change an electrical length of the first transmission path based on a frequency of the RF signal, and a second variable impedance circuit (e.g., a second variable impedance circuit 450) located on the second transmission path and configured to change an electrical length of the second transmission path based on a power mode.

According to various example embodiments, the first variable impedance circuit may set λ/4 impedance corresponding to the frequency of the RF signal.

According to various example embodiments, the first variable impedance circuit or the second variable impedance circuit may include a conductive line having specific impedance and a switch configured to vary a path where the RF signal is transmitted in the conductive line. The switch may be configured to set the path where the RF signal is transmitted in the conductive line based on the frequency of the RF signal.

According to various example embodiments, the first variable impedance circuit may include a first inductor located on a path between an input terminal and an output terminal of the first variable impedance circuit, a first variable capacitor located on a path between a path between the input terminal of the first variable impedance circuit and the first inductor and a ground, a second variable capacitor located on a path between a path between the output terminal of the first variable impedance circuit and the first inductor and the ground, and a first switch connected with the first inductor configured to vary inductance of the first inductor. The first switch may be configured to set the inductance of the first inductor to a specific value based on the frequency of the RF signal.

According to various example embodiments, the first switch may include a first terminal and at least one second terminal. The first terminal may be connected with the path between the output terminal of the first variable impedance circuit and the first inductor, and the at least one second terminal may be connected with a specific portion of the first inductor. The first terminal may be connected with the at least one second terminal or may be configured to maintain an open state, based on the frequency of the RF signal.

According to various example embodiments, the first switch may include a micro-electro mechanical systems (MEMS) switch.

According to various example embodiments, the amplifier circuit may further include a switch control circuit. The switch control circuit may be configured to receive a switch control signal corresponding to the frequency of the RF signal from the wireless communication circuit and may be configured to generate a first switch signal for controlling the first switch based on the switch control signal.

According to various example embodiments, the second variable impedance circuit may be configured to have an impedance value of a specific value or more in response to the frequency of the RF signal, in a low power mode.

According to various example embodiments, the second variable impedance circuit may be configured to have an impedance value of a specific value or less in response to the frequency of the RF signal, in a high power mode.

According to various example embodiments, an impedance value of the second variable impedance circuit may be set to be a specific impedance value by synthesis of impedance of the first variable impedance circuit and impedance of the second variable impedance circuit.

According to various example embodiments, the second variable impedance circuit may include a second inductor located on a path between an input terminal and an output terminal of the second variable impedance circuit, a third variable capacitor located on a path between a path between the input terminal of the second variable impedance circuit and the second inductor and a ground, a fourth variable capacitor located on a path between a path between the output terminal of the second variable impedance circuit and the second inductor and the ground, and a second switch connected with the second inductor to vary inductance of the second inductor. The second switch may be configured set the inductance of the second inductor to a specific value based on the frequency of the RF signal.

According to various example embodiments, the second switch may include a third terminal and at least one fourth terminal. The third terminal may be connected with the path between the output terminal of the second variable impedance circuit and the second inductor, and the at least one fourth terminal may be connected with a specific portion of the second inductor. The third terminal may be connected with the at least one fourth terminal or may be configured to maintain an open state, based on the frequency of the RF signal.

According to various example embodiments, the second switch may include a micro-electro mechanical systems (MEMS) switch.

According to various example embodiments, the amplifier circuit may further include a switch control circuit. The switch control circuit may be configured to receive a switch control signal corresponding to the frequency of the RF signal from the wireless communication circuit and may generate a second switch signal for controlling the second switch based on the switch control signal.

According to various example embodiments, the electronic device may further include a signal distribution circuit configured to receive the RF signal and to generate a first distribution signal input to the first amplifier and a second distribution signal input to the second amplifier.

According to various example embodiments, the first distribution signal and the second distribution signal have a specific phase difference.

According to various example embodiments, the signal distribution circuit may include a wideband distributor configured to distribute the RF signal and a third variable impedance circuit having a specific impedance value based on the frequency of the RF signal wherein one of output signals of the wideband distributor has a specific phase.

According to various example embodiments, the third variable impedance circuit may set λ/4 impedance corresponding to the frequency of the RF signal.

According to various example embodiments, the electronic device may further include a first input matching circuit configured to perform impedance matching between the wireless communication circuit and the first amplifier based on the frequency of the RF signal and a second input matching circuit configured to perform impedance matching between the wireless communication circuit and the second amplifier based on the frequency of the RF signal.

According to various example embodiments, the electronic device may further include a first output matching circuit configured to perform output matching of the first amplifier based on the frequency of the RF signal and a second output matching circuit configured to perform output matching of the second amplifier based on the frequency of the RF signal.

The electronic device according to various embodiments may be one of various types of electronic devices. The electronic devices may include, for example, a portable communication device (e.g., a smartphone), a computer device, a portable multimedia device, a portable medical device, a camera, a wearable device, a home appliance, or the like. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B", "at least one of A and B", "at least one of A or B", "A, B, or C", "at least one of A, B, and C", and "at least one of A, B, or C" may include any one of, or all possible combinations of the items enumerated together in a corresponding one of the phrases. As used herein, such terms as "1st" and "2nd", or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with", "coupled to", "connected with", or "connected to" another element (e.g., a second element), the element may be coupled with the other element directly (e.g., wiredly), wirelessly, or via a third element.

As used herein, the term "module" may include a unit implemented in hardware, software, or firmware, or any combination thereof, and may interchangeably be used with other terms, for example, "logic", "logic block", "part", or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a compiler or a code executable by an interpreter. The machine-readable storage medium may be provided in the form of a non-transitory storage medium. Wherein, the "non-transitory" storage medium is a tangible device, and may not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

While the disclosure has been illustrated and described with reference to various example embodiments, it will be understood that the various example embodiments are intended to be illustrative, not limiting. It will be further understood by those skilled in the art that various changes in form and detail may be made without departing from the true spirit and full scope of the disclosure including the appended claims and their equivalents. It will also be understood that any of the embodiment(s) described herein may be used in conjunction with any other embodiment(s) described herein.

What is claimed is:

1. An electronic device, comprising:
   a wireless communication circuit configured to generate a radio frequency (RF) signal;
   an amplifier circuit electrically connected with the wireless communication circuit and configured to amplify the RF signal; and
   an antenna connected with the amplifier circuit,
   wherein the amplifier circuit includes:
   a switch control circuit,
   a first amplifier;
   a second amplifier;
   a first transmission path connected with an output terminal of the first amplifier and the antenna;
   a second transmission path connected with an output terminal of the second amplifier and the first transmission path;
   a first variable impedance circuit located on the first transmission path and comprising a first inductor located on a path between at least an input terminal and an output terminal of the first variable impedance circuit and a first switch connected with the first inductor; and
   a second variable impedance circuit located on the second transmission path and comprising a second inductor located on a path between at least an input terminal and an output terminal of the second variable impedance circuit and a second switch connected with the second inductor,
   wherein the first switch comprises a first terminal connected to an output terminal of the first inductor and a second terminal selectively connectable to a point of the first inductor,
   wherein the second switch comprises a third terminal connected to an output terminal of the second inductor and a fourth terminal selectively connectable to a point of the second inductor, and
   wherein the switch control circuit is configured to:
   change an electrical length of the first transmission path based on a frequency of the RF signal by controlling the first switch,
   in a low power mode, control an impedance value of the second variable impedance circuit to be a specific value or more by controlling the second switch, and
   in a high power mode, control the impedance value of the second variable impedance circuit to be lower than the specific value by controlling the second switch based on the frequency of the RF signal.

2. The electronic device of claim 1, wherein the first variable impedance circuit is configured to set λ/4 impedance corresponding to the frequency of the RF signal.

3. The electronic device of claim 1, wherein the first variable impedance circuit further includes:
   a first variable capacitor located on a path between a path between the input terminal of the first variable impedance circuit and the first inductor and a ground; and
   a second variable capacitor located on a path between a path between the output terminal of the first variable impedance circuit and the first inductor and the ground.

4. The electronic device of claim 3,
   wherein the second terminal is connected with the point of the first inductor to form a bypass path or is configured to be in an open state.

5. The electronic device of claim 3,
   wherein the switch control circuit is configured to receive a switch control signal corresponding to the frequency of the RF signal from the wireless communication circuit and to generate a first switch signal for controlling the first switch based on the switch control signal.

6. The electronic device of claim 1, wherein the second variable impedance circuit further includes:
   a third variable capacitor located on a path between a path between the input terminal of the second variable impedance circuit and the second inductor and a ground; and
   a fourth variable capacitor located on a path between a path between the output terminal of the second variable impedance circuit and the second inductor and the ground.

7. The electronic device of claim 6,
   wherein the third terminal is connected with the path between the output terminal of the second variable impedance circuit and the second inductor, and
   wherein the fourth terminal is selectively connected with a specific portion of the second inductor.

8. The electronic device of claim 7,
   wherein the switch control circuit is configured to receive a switch control signal corresponding to the frequency of the RF signal from the wireless communication circuit and to generate a second switch signal for controlling the second switch based on the switch control signal.

9. The electronic device of claim 1, further comprising:
a signal distribution circuit configured to receive the RF signal and to generate a first distribution signal input to the first amplifier and a second distribution signal input to the second amplifier.

10. The electronic device of claim 9, wherein the first distribution signal and the second distribution signal are generated to have a specific phase difference.

11. The electronic device of claim 9, wherein the signal distribution circuit includes:
a wideband distributor configured to distribute the RF signal; and
a third variable impedance circuit configured to have a specific impedance value based on the frequency of the RF signal wherein one of output signals of the wideband distributor has a specific phase.

\* \* \* \* \*